United States Patent
Stocksdale et al.

(10) Patent No.: US 10,180,906 B2
(45) Date of Patent: Jan. 15, 2019

(54) HBM WITH IN-MEMORY CACHE MANAGER

(71) Applicant: Samsung Electronics Co., Ltd., Suwon-si, Gyeonggi-do (KR)

(72) Inventors: Tyler Stocksdale, Raleigh, NC (US); Mu-Tien Chang, Santa Clara, CA (US); Hongzhong Zheng, Los Gatos, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 136 days.

(21) Appl. No.: 15/272,339

(22) Filed: Sep. 21, 2016

(65) Prior Publication Data
US 2018/0032437 A1     Feb. 1, 2018

Related U.S. Application Data
(60) Provisional application No. 62/367,062, filed on Jul. 26, 2016.

(51) Int. Cl.
G06F 12/0862     (2016.01)
G06F 12/0893     (2016.01)

(52) U.S. Cl.
CPC ...... *G06F 12/0862* (2013.01); *G06F 12/0893* (2013.01); *G06F 2212/1024* (2013.01);
(Continued)

(58) Field of Classification Search
CPC ......... G06F 12/0862; G06F 2212/6028; G11C 2207/107; G11C 2211/5643; G11C 2207/2245
See application file for complete search history.

(56) References Cited

U.S. PATENT DOCUMENTS 6,594,728 B1 * 7/2003 Yeager ................ G06F 12/0851
711/120
8,885,380 B2 * 11/2014 Kang ...................... H01L 25/18
365/51

(Continued)

OTHER PUBLICATIONS

Sun, G., et al., "A Novel Architecture of the 3D Stacked MRAM L2 Cache for CMPs", 2009 IEEE 15th International Symposium on HighPerformance Computer Architecture. IEEE, 2009; https://seal.ece.ucsb.edu/sites/seal.ece.ucsb.edu/files/publications/04798259.pdf (pp. 239-249).

*Primary Examiner* — Khamdan N. Alrobaie
(74) *Attorney, Agent, or Firm* — Lewis Roca Rothgerber Christie LLP

(57) ABSTRACT

A system and method for using high bandwidth memory as cache memory. A high bandwidth memory may include a logic die, and, stacked on the logic die, a plurality of dynamic read-only memory dies. The logic die may include a cache manager, that may interface to external systems through an external interface conforming to the JESD235A standard, and that may include an address translator, a command translator, and a tag comparator. The address translator may translate each physical address received through the external interface into a tag value, a tag address in the stack of memory dies, and a data address in the stack of memory dies. The tag comparator may determine whether a cache hit or cache miss has occurred, according to whether the tag value generated by the address translator matches the tag value stored at the tag address.

20 Claims, 5 Drawing Sheets

(52) U.S. Cl.
CPC ............... *G06F 2212/6028* (2013.01); *G11C 2207/107* (2013.01); *G11C 2211/5643* (2013.01)

(56) References Cited

U.S. PATENT DOCUMENTS

| | | |
|---|---|---|
| 9,053,039 B2 | 6/2015 | Poremba et al. |
| 2008/0263257 A1* | 10/2008 | Cain, III ............. G06F 12/0862 711/3 |
| 2012/0221785 A1* | 8/2012 | Chung .................... G11C 5/02 711/105 |
| 2012/0297256 A1 | 11/2012 | Plondke et al. |
| 2013/0138892 A1 | 5/2013 | Loh et al. |
| 2014/0143497 A1* | 5/2014 | Olson ................. G06F 12/0802 711/132 |
| 2014/0181417 A1* | 6/2014 | Loh .................... G06F 12/0828 711/141 |
| 2015/0019813 A1 | 1/2015 | Loh et al. |
| 2015/0113356 A1 | 4/2015 | Ken et al. |
| 2015/0153965 A1* | 6/2015 | Park ....................... G06F 11/10 711/154 |

* cited by examiner

HBM WITH IN-MEMORY CACHE MANAGER

CROSS-REFERENCE TO RELATED APPLICATION(S)

The present application claims priority to and the benefit of U.S. Provisional Application No. 62/367,062, filed Jul. 26, 2016, entitled "HBM WITH IN-MEMORY CACHE MANAGER", the entire content of which is incorporated herein by reference.

FIELD

One or more aspects of embodiments according to the present invention relate to high bandwidth memory, and more particularly to a system and method for using high bandwidth memory as cache memory.

BACKGROUND

High Bandwidth Memory (HBM) is a high-performance (RAM) interface for three dimensional (3D)-stacked dynamic RAM (DRAM). Related art systems using HBM as cache memory may have a cache manager on the host, to perform cache management functions. This arrangement may burden the host and the interface between the host and the HBM.

Thus, there is a need for an improved system and method of using HBM as cache memory.

SUMMARY

Aspects of embodiments of the present disclosure are directed toward a system and method for using high bandwidth memory as cache memory. A high bandwidth memory may include a logic die, and, stacked on the logic die, a plurality of dynamic random access memory dies. The logic die may include a cache manager, that may interface to external systems through an external interface conforming to the JESD235A standard, and that may include an address translator, a command translator, and a tag comparator. The address translator may translate each physical address received through the external interface into a tag value, a tag address in the stack of memory dies, and a data address in the stack of memory dies. The tag comparator may determine whether a cache hit or cache miss has occurred, according to whether the tag value generated by the address translator matches the tag value stored at the tag address. The command generator may generate commands. For example, upon receiving a write command through the external interface, the command generator may first generate a command to fetch a tag value, to determine whether a cache hit has occurred, and, if it has, the command generator may generate a write command.

According to an embodiment of the present invention there is provided a memory system, including: a memory stack including a plurality of memory dies; and a logic die, the memory dies being stacked on, and connected to, the logic die, the logic die having an external interface to the memory system, the logic die including a cache manager.

In one embodiment, the cache manager includes an address translator configured to translate an address received through the external interface to produce: a first tag value; a data address in the memory stack; and a tag address in the memory stack.

In one embodiment, the cache manager includes a command translator configured to generate, in response to a read command received through the external interface: a first command to fetch a tag; and a second command to fetch a data word.

In one embodiment, the cache manager includes a tag comparator to generate a cache hit signal, the cache hit signal having: a value of true when the first tag value equals a value resulting from execution of the first command; and a value of false when the first tag value does not equal the value resulting from the execution of the first command.

In one embodiment, the tag comparator is configured to send the cache hit signal through a first pin of the external interface.

In one embodiment, the cache manager is configured to send the value of a dirty bit and/or the value of a valid bit through a second pin of the external interface.

In one embodiment, the cache manager is configured to send the cache hit signal through the first pin, during a first interval of time, and to send the value of a dirty bit thorough the first pin, during a second interval.

In one embodiment, the cache manager is configured to execute the first command through a pseudo channel.

In one embodiment, the cache manager includes a mode selector to indicate either that a parallel mode of operation is selected or that a serial mode of operation is selected, the cache manager being configured: to execute the first command in parallel with the second command when the mode selector indicates that a parallel mode of operation is selected; and to execute the first command before executing the second command when the mode selector indicates that the serial mode of operation is selected.

In one embodiment, the mode selector is configured to be controlled through the external interface.

In one embodiment, for any two data words stored in a first bank in the memory dies and accessible through different pseudo channels, two corresponding tags are stored in different subarrays of the stack.

In one embodiment, the external interface is configured to operate in compliance with Joint Electron Device Engineering Council standard JESD235A.

According to an embodiment of the present invention there is provided a processing system, including: a host processor; a first memory system connected to the host processor; and a second memory system connected to the host processor, the first memory system including: a memory stack including a plurality of memory dies; and a logic die, the memory dies being stacked on, and connected to, the logic die, the logic die having an external interface to the memory system, the logic die including a cache manager, the second memory system being configured as backing store for the first memory system.

In one embodiment, the cache manager includes an address translator configured to translate an address received from the host processor through the external interface to: a first tag value; a data address in the memory stack; and a tag address in the memory stack.

In one embodiment, the cache manager includes a command translator configured to generate, in response to a read command received from the host processor through the external interface: a first command to fetch a tag; and a second command to fetch a data word.

In one embodiment, the cache manager includes a tag comparator to generate a cache hit signal, the cache hit signal having: a value of true when the first tag value equals a value resulting from execution of the first command; and a value of false when the first tag value does not equal a value resulting from execution of the first command.

In one embodiment, the external interface is configured to operate in compliance with Joint Electron Device Engineering Council standard JESD235A.

According to an embodiment of the present invention there is provided a method for operating a memory stack including a plurality of memory dies and a logic die, the memory dies being stacked on, and connected to, the logic die, the logic die having an external interface to the memory system, the method including: translating, by the logic die, an address received through the external interface to produce: a first tag value; a data address in the memory stack; and a tag address in the memory stack.

In one embodiment, the method includes, generating, by the logic die, in response to a read command received through the external interface: a first command to fetch a tag; and a second command to fetch a data word.

In one embodiment, the method includes, generating, by the logic die, a cache hit signal, the cache hit signal having: a value of true when the first tag value equals a value resulting from execution of the first command; and a value of false when

BRIEF DESCRIPTION OF THE DRAWINGS

These and other features and advantages of the present invention will be appreciated and understood with reference to the specification, claims, and appended drawings wherein:

DETAILED DESCRIPTION

Figure 1:
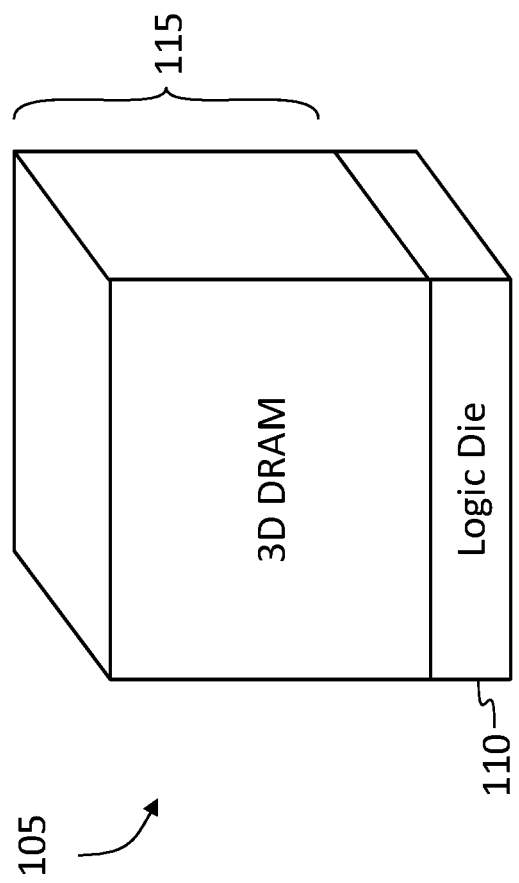
FIG. 1 is a perspective view of a high bandwidth memory stack, according to an embodiment of the present invention.

The detailed description set forth below in connection with the appended drawings is intended as a description of exemplary embodiments of a high bandwidth memory with in-memory cache manager provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

High bandwidth memory (HBM) is a high-performance three dimensional (3D)-stacked dynamic random access memory RAM (DRAM). Second generation High Bandwidth Memory may include up to 8 dies per stack and provide pin transfer rates of up to 2 GT/s (giga transfers per second). The interface may include 8 channels, each 128 bits wide, for a total of 1024-bit wide access. Second generation High Bandwidth Memory may be able to reach 256 GB/s memory bandwidth per package, and may have a storage capacity of up to 8 GB per package. The interface of a second generation High Bandwidth Memory may comply with a standard accepted by the Joint Electron Device Engineering Council (JEDEC) as standard JESD235A.

The physical configuration of an HBM stack 105 may include a logic die 110, and a three dimensional DRAM or "DRAM stack" 115, including a plurality of DRAM dies (e.g., 8 such dies) stacked on top of the logic die 110. Interconnections are formed within the stack with through-silicon vias (TSVs). Related art HBM stacks may include, in the logic die, connections and signal conditioning circuitry, as a result of which the DRAM channel interfaces are presented, substantially unchanged, to the host processor at the external interface of the HBM.

Figures 2A, 2B:
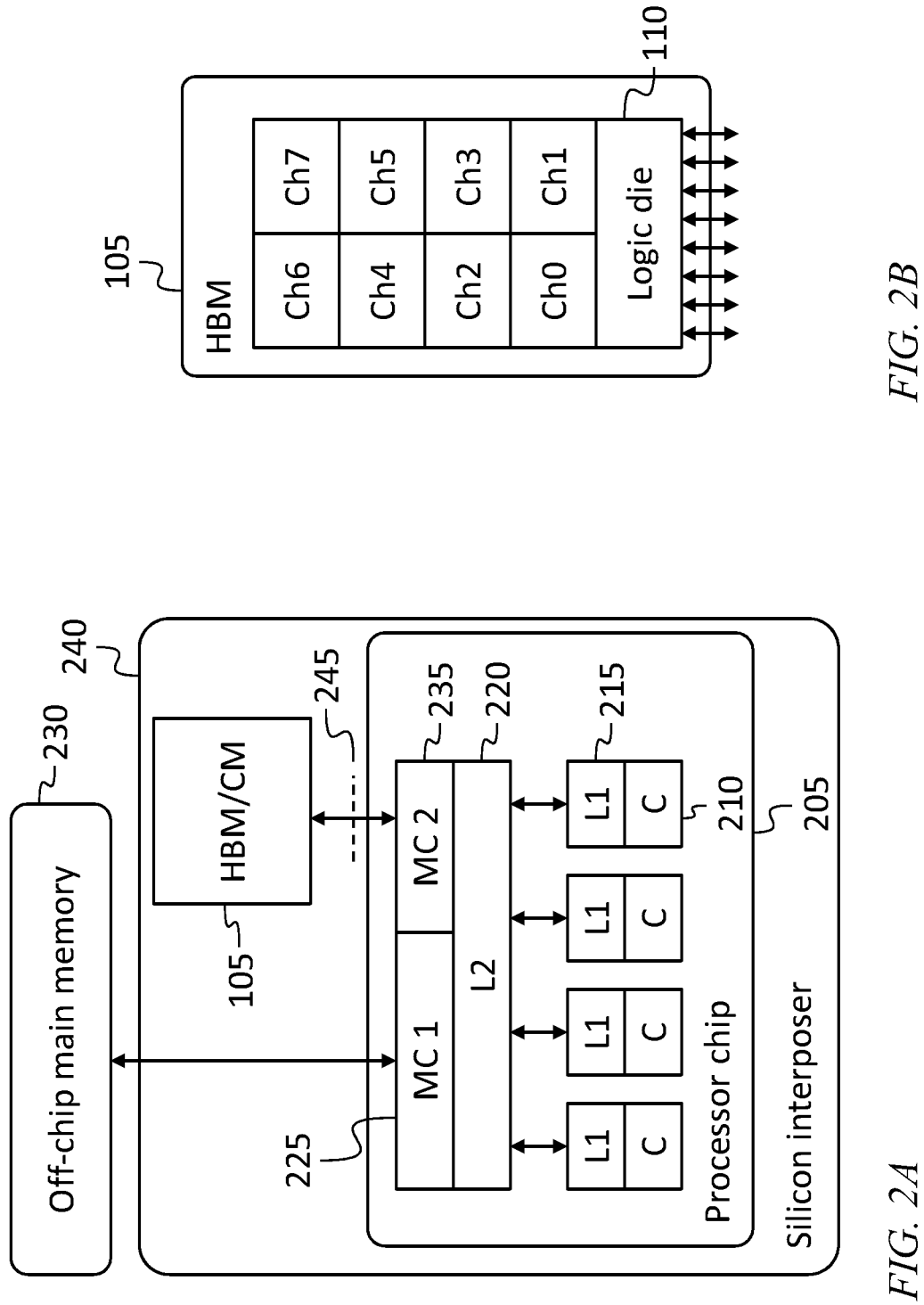
FIG. 2A is a block diagram of a processing system employing a high bandwidth memory stack as a level 3 cache, according to an embodiment of the present invention.
FIG. 2B is a block diagram of a high bandwidth memory stack, according to an embodiment of the present invention.

Referring to FIG. 2A, an HBM stack 105 may be connected to a host processor 205 (e.g., a CPU or a GPU). The host processor 205 may include a plurality of cores 210, each having a respective level 1 cache 215. Level 2 cache 220 may be connected to the level 1 caches 215, and a first memory controller 225 may provide in interface to the off chip main memory 230. A second memory controller 235 may provide an interface to the HBM stack 105. The HBM stack 105 may include a cache manager (CM) in the logic die of the HBM stack 105. The HBM stack 105, with its integrated cache manager, may be employed by the host processor 205 as a level 3 cache (or, e.g., as a level 4 cache in a system also having a level 3 cache). The HBM interface 245 may be a JESD235A compliant interface, i.e., it may provide conductors and signaling protocols specified by the JESD235A standard.

Referring to FIG. 2B, in some embodiments, the HBM stack 105 may include the logic die 110, which may be connected to the DRAM, in the DRAM stack 115, through eight internal interfaces referred to as channels, and shown in FIG. 2B as Ch0-Ch7.

Figure 3:
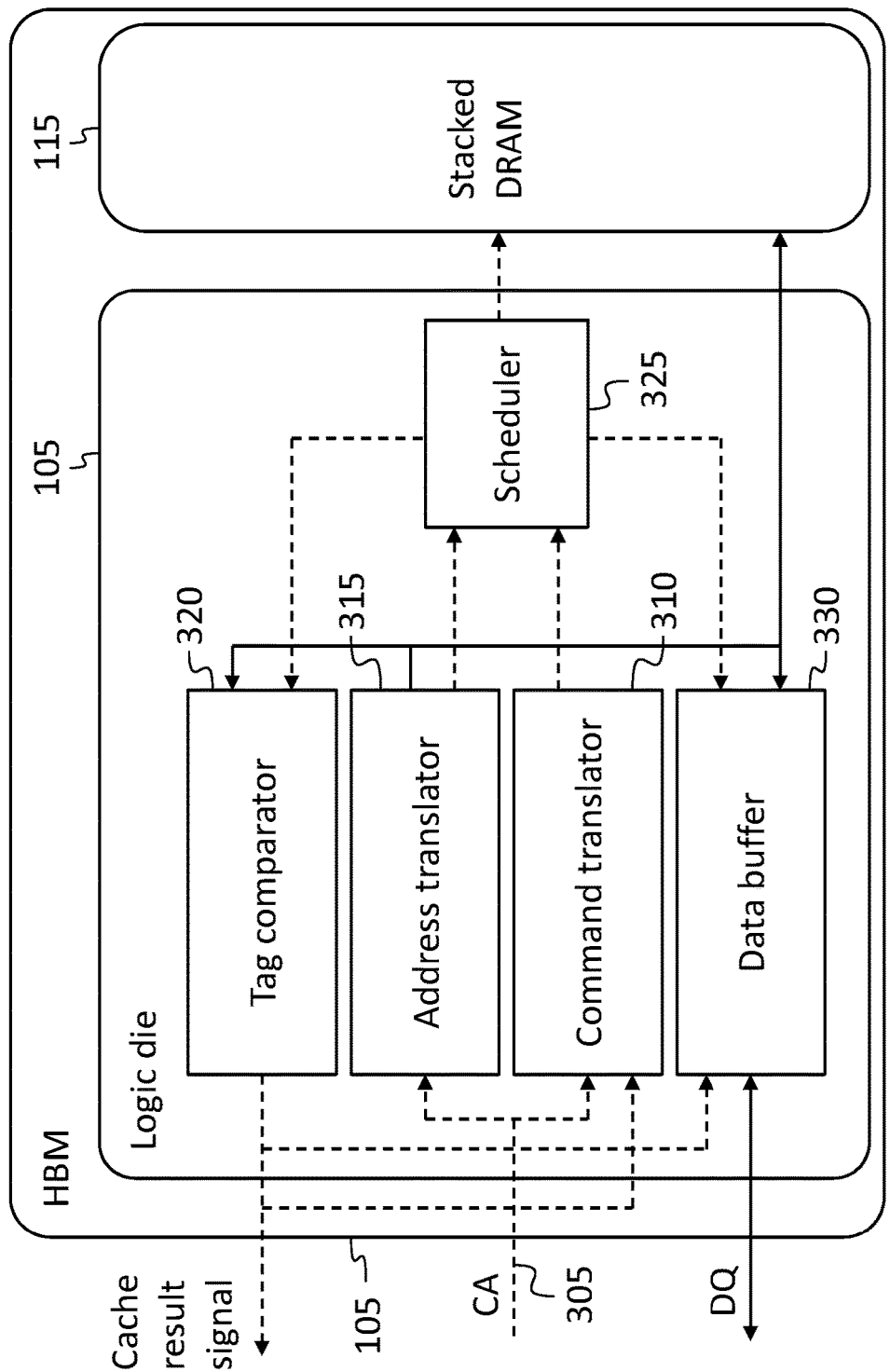
FIG. 3 is a block diagram of a high bandwidth memory stack, according to an embodiment of the present invention.

Referring to FIG. 3, in one embodiment the HBM stack 105 includes, as mentioned above, a DRAM stack 115 and a logic die 110, and the logic die 110 can include a plurality of components implementing a cache manager. Command and address lines 305 in the HBM interface 245 may be connected, in the logic die 110 of the HBM stack 105, to a command translator 310 and to an address translator 315. The command and address lines 305 may include, for example 6 row command/address lines and 8 column command/address lines for each of the 8 channels of the HBM interface 245.

In operation, the address translator 315 may periodically receive a physical memory address for which a command (e.g., a read command or a write command) is to be performed. The address translator 315 may then translate the address into a tag value, a tag address, and a data address. The tag value may be used to determine whether a "cache hit" has occurred, i.e., whether the address in the cache is currently allocated to the address received through the HBM interface 245. For example, the cache manager may read (or "fetch") the tag value at the tag address and compare it (e.g., with a tag comparator 320, described in further detail below) to the tag value produced by the address translator 315. If the tag value formed (by the address translator 315) from the received physical address matches the tag value stored at the tag address in the DRAM stack 115 then a cache hit has occurred, i.e., the address in the cache is currently allocated to the received address in the physical memory space of the processor. If the tag value formed from the received physical address does not match the tag value stored at the tag address in the DRAM stack 115 (a situation referred to herein as a "cache miss"), then the address in the cache is not currently allocated to the received address in the physical memory space of the processor.

The tag comparator 320 may be used to make the comparison, i.e., to compare the tag value formed from the received physical address to the tag value stored at the tag address. The output of the tag comparator 320 may be a signal referred to as a cache hit signal, having a value of true (e.g., a value of binary 1) when a cache hit occurs, and a value of false (e.g., a value of binary 0) when a cache miss occurs.

The command translator 310 may generate, in response to commands received through the HBM interface 245, commands to be executed on the DRAM stack 115. For example, if the command received through the HBM interface 245 is a read command, the command translator 310 may generate a command to read a data word stored at the data address, and a command to read a tag value stored at the tag address. Each of these commands may include (e.g., be composed of) a plurality of micro-operations, e.g., a read command may include an activate operation followed by a read operation.

If the command received through the HBM interface 245 is a write command, the command translator 310 may first generate a command to read a tag stored at the tag address, and if the tag value matches the tag value generated by the address translator 315, it may then generate a write command to write data to the DRAM stack 115. As such, including a cache manager in the logic die 110 may, in addition to making it unnecessary for the host processor 205 to implement the cache manager, result in improved efficiency, by allowing the second command (the write command) to be generated in the logic die 110 rather than in the host processor 205.

The fetching of tag values and data may be performed in parallel or in series. For example, when the cache manager is operating in a parallel mode, the tag value and data may be fetched in parallel, the fetched tag value may be compared, by the tag comparator 320, to the tag value produced by the address translator 315, and, if the two tag values match, the data read may be returned through the HBM interface 245. Otherwise a cache miss may be signaled to the host processor 205 through the HBM interface 245, as discussed in further detail below. When the cache manager is operating in a series mode the tag value may be fetched first, the fetched tag value may be compared, by the tag comparator 320, to the tag value produced by the address translator 315, and, if the two tag values match, the data may be fetched and returned through the HBM interface 245. Otherwise a cache miss may be signaled to the host processor 205 through the HBM interface 245. Operation in serial mode may be more power-efficient than operation in parallel mode because in serial mode the data fetch operations are performed only in the case of a cache hit. Operation in parallel mode may be faster than operation in serial mode, because in parallel mode the tag value fetch and the data fetch may be performed concurrently. The cache manager may include a mode selector (e.g., a bit in a control register) that may control whether the cache manager operates in a parallel mode or in serial mode. The mode selector may be controllable (e.g., by the host processor 205) through the HBM interface 245, e.g., by a command to write a new value to the control register.

The cache manager may store, with each tag, two bits of metadata, (i) a bit (a "valid bit" that indicates whether the corresponding data word is valid or invalid, and (ii) a bit (a "dirty bit") that indicates whether the corresponding data word is dirty or clean. Data in the cache are considered dirty if the data in the cache have been updated without the corresponding data in the backing store having been updated (and clean otherwise) and data in the cache are considered invalid if the data in the backing store have been updated without the corresponding data in the cache having been updated (and valid otherwise).

Further, commands received through the HBM interface 245 may result, as mentioned above, in a true or false value of the cache hit signal (corresponding to a cache hit or a cache miss, respectively). Upon completion of any command received by the HBM stack 105 through the HBM interface 245, the cache manager may generate three values, one each for the cache hit signal, for the dirty bit, and for the valid bit. These values may be communicated to the host processor 205 through the HBM interface 245 using one or more pins of the HBM interface 245 not used for other functions, e.g., pins that are not (i) any of the 212 pins of each of the eight channels nor (ii) any of the RESET, TEMP[2:0] OR CATTRIP pins. Pins that are defined by the JESD235A standard as pins that are reserved for future use (RFU pins) may be used. For example, in one embodiment, an RFU pin is used to transmit, during the first data cycle of a data burst after the command has been executed, the cache hit signal, and during the next data cycle of the data burst, the value of the dirty bit. The sending of the cache hit signal and of the dirty bit may be synchronized with the sending of the data of the data burst. In some embodiments a plurality of RFU pins is used to transmit the cache hit signal, the dirty bit, and/or the valid bit.

To invalidate data in the cache, the host processor 205 may send an "invalidate" signal to the logic die 110 through the HBM interface 245, along with the address of the data to be invalidated. The "invalidate" signal may be sent through the same pin (e.g., an RFU pin) of the HBM interface 245 used to send the cache hit signal to the host processor 205. The address may be sent over the CA bus of the HBM interface 245. With this information, the logic die 110 may then update the corresponding valid bit stored in the DRAM stack 115.

In some embodiments, RFU pins are also used to maintain cache coherency, e.g., to maintain coherency between the backing store (e.g., the off chip main memory 230) and the cache in a multi-core system such as that of FIG. 2A, in which both the level 3 cache (implemented in the HBM stack 105) and the backing store may be read and/or modified by each of the cores 210.

A scheduler 325 in the logic die 110 may receive commands and addresses from the command translator 310 and from the address translator 315 respectively, and schedule the execution of these commands on the DRAM stack 115. A data buffer 330 in the logic die 110 may be used to store data temporarily after it is received through the HBM interface 245 and/or after it is read from the DRAM stack 115. Both the scheduler 325 and the data buffer 330 may help to accommodate variations in the rates at which (i) commands are received through the HBM interface 245, (ii) command are executed on the DRAM stack 115, (iii) data are sent or received through the HBM interface 245 and (iv) data are read from or written to the DRAM stack 115.

The JESD235A standard provides for operation in a pseudo channel mode, in which each of the 8 128-bit channels operates as two semi-independent pseudo channels. In this mode each pair of pseudo channels shares the channel's row and column command bus as well as CK and CKE inputs, although the two pseudo channels decode and execute commands individually. In some embodiments, this mode is used to store tag values. Each tag value may be a 32 bit word, resulting in significant inefficiency (e.g., 25% efficiency) if the entire 128 bit wide data bus (the "DQ" bus) of a channel is used to read a tag value from, or write a tag value to, the DRAM stack 115. In pseudo channel mode only half of this bus width, i.e., 64 bits, may be used to read or write the tag value, resulting in higher (e.g., 50%) efficiency.

Figure 4A:
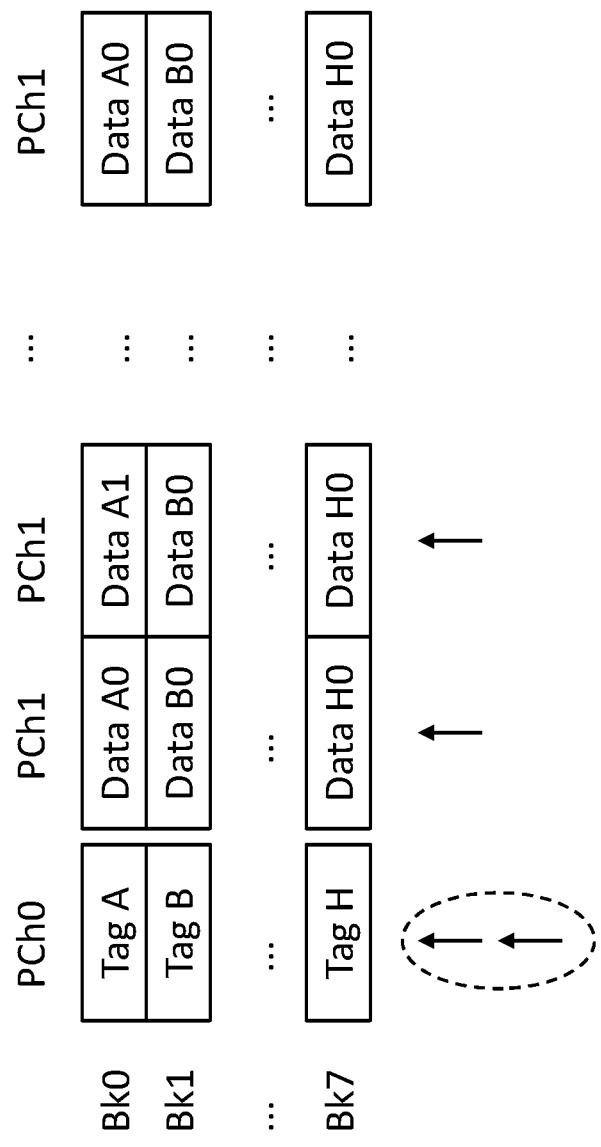
FIG. 4A is a storage diagram, according to an embodiment of the present invention.
Figure 4B:
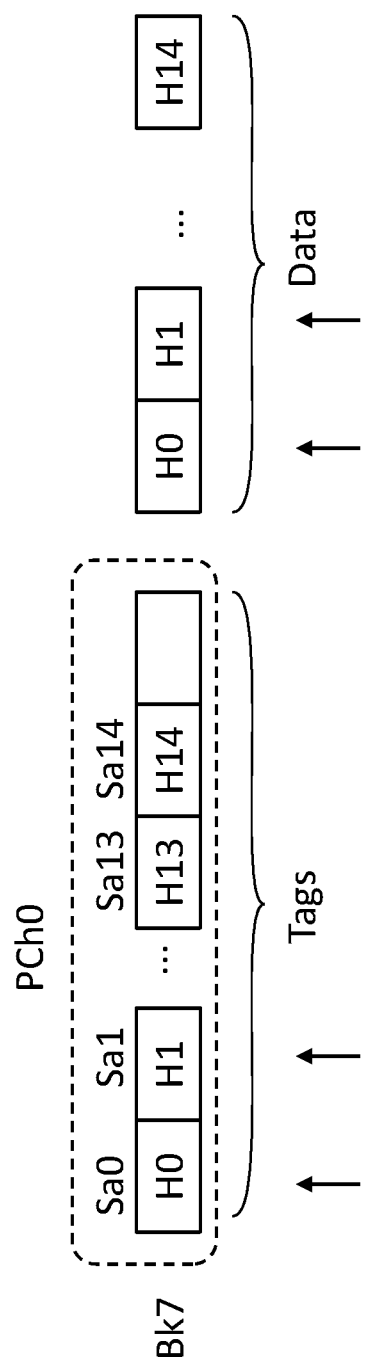
FIG. 4B is a storage diagram, according to an embodiment of the present invention.

Each bank of DRAM may include (i.e., be composed of) 16 subarrays. Referring to FIG. 4A, in some embodiments, each data word may be 64 bytes (512 bits) long, and each tag value may be 4 bytes (32 bits) long, i.e., the lengths may be in a 16:1 ratio. Tag values and data may be accessed through different channels; for example data may be accessed through channels 1~15 and the tag values may be accessed through channel 0. In such an embodiment, it may be possible to access the data in parallel, but tag accesses may experience bank conflicts, as shown by the dashed ellipse. Accordingly, referring to FIG. 4B, in one embodiment, the tags are stored in different subarrays, which can be accessed in parallel, using a method referred to herein as subarray level parallelism (SALP). In such an embodiment, it may be possible for tag accesses to be processed concurrently, i.e., to avoid conflicts for tag accesses, even when the tag accesses are made to the same bank.

In light of the foregoing, a HBM stack 105 including a cache manager in the logic die 110 may have a number of advantages over a related art HBM stack that lacks a cache manager. The use of an HBM stack 105 including a cache manager may make it unnecessary to include the cache manager in the host processor 205, potentially reducing the size, cost, and power consumption of the host processor, or making it possible to put the same resources to other use in the host processor 205. Moreover, conditional execution may be faster when performed entirely in the HBM stack 105 than when such conditional execution involves the host processor 205. For example, a write command may be executed more quickly in the event of a cache hit when the cache hit determination is made in the HBM stack 105 than if it is made in a cache manager in the host processor 205.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a high bandwidth memory with in-memory cache manager have been specifically described and illustrated herein, many modifications and variations will be apparent to those skilled in the art. Accordingly, it is to be understood that a high bandwidth memory with in-memory cache manager constructed according to principles of this invention may be embodied other than as specifically described herein. The invention is also defined in the following claims, and equivalents thereof.

What is claimed is:

1. A memory system, comprising:
a memory stack comprising a plurality of memory dies; and
a logic die,
the memory dies being stacked on, and connected to, the logic die,
the logic die having an external interface to a host processor,
the logic die comprising a cache manager configured to:
translate an address received, as part of a command, through the external interface, to produce:
a first tag value, and
a tag address,
fetch a second tag value from a location in the memory stack corresponding to the tag address,
compare the first tag value and the second tag value, and
execute the command, based on the comparing of the first tag value and the second tag value.

2. The memory system of claim 1, wherein the cache manager comprises an address translator configured to translate the address received through the external interface to produce:
the first tag value;
a data address in the memory stack; and
the tag address in the memory stack.

3. The memory system of claim 2, wherein the cache manager comprises a command translator configured to generate, in response to a read command received through the external interface:
a first command to fetch the second tag value; and
a second command to fetch a data word.

4. The memory system of claim 3, wherein the cache manager comprises a tag comparator to generate a cache hit signal, the cache hit signal having;
a value of true when the first tag value equals the second tag value; and
a value of false when the first tag value does not equal the second tag value.

5. The memory system of claim 4, wherein the tag comparator is configured to send the cache hit signal through a first pin of the external interface.

6. The memory system of claim 5, wherein the cache manager is configured to send the value of a dirty bit and/or the value of a valid bit through a second pin of the external interface.

7. The memory system of claim 5, wherein the cache manager is configured to send the cache hit signal through the first pin, during a first interval of time, and to send the value of a dirty bit thorough the first pin, during a second interval.

8. The memory system of claim 3, wherein the cache manager is configured to execute the first command through a pseudo channel.

9. The memory system of claim 3, wherein the cache manager comprises a mode selector to indicate either that a parallel mode of operation is selected or that a serial mode of operation is selected, the cache manager being configured:
to execute the first command in parallel with the second command when the mode selector indicates that a parallel mode of operation is selected; and
to execute the first command before executing the second command when the mode selector indicates that the serial mode of operation is selected.

10. The memory system of claim 9, wherein the mode selector is configured to be controlled through the external interface.

11. The memory system of claim 1, wherein for any two data words stored in a first bank in the memory dies and accessible through different pseudo channels, two corresponding tags are stored in different subarrays of the memory stack.

12. The memory system of claim 1, wherein the external interface is configured to operate in compliance with Joint Electron Device Engineering Council standard JESD235A.

13. A processing system, comprising:
a host processor;
a first memory system connected to the host processor; and
a second memory system connected to the host processor,
the first memory system comprising:
a memory stack comprising a plurality of memory dies; and
a logic die,
the memory dies being stacked on, and connected to, the logic die,
the logic die having an external interface to the host processor,
the logic die comprising a cache manager configured to:
translate an address received, as part of a command, through the external interface to produce:
a first tag value, and
a tag address,
fetch a second tag value from a location in the memory stack corresponding to the tag address,
compare the first tag value and the second tag value, and
execute the command, based on the comparing of the first tag value and the second tag value,
the second memory system being configured as backing store for the first memory system.

14. The processing system of claim 13, wherein the cache manager comprises an address translator configured to translate the address received from the host processor through the external interface to produce:
the first tag value;
a data address in the memory stack; and
the tag address in the memory stack.

15. The processing system of claim 14, wherein the cache manager comprises a command translator configured to generate, in response to a read command received from the host processor through the external interface:
a first command to fetch the second tag value; and
a second command to fetch a data word.

16. The processing system of claim 15, wherein the cache manager comprises a tag comparator to generate a cache hit signal, the cache hit signal having;
a value of true when the first tag value equals the second tag value; and
a value of false when the first tag value does not equal the second tag value.

17. The processing system of claim 13, wherein the external interface is configured to operate in compliance with Joint Electron Device Engineering Council standard JESD235A.

18. A method for operating a memory stack comprising a plurality of memory dies and a logic die, the memory dies being stacked on, and connected to, the logic die, the logic die having an external interface to a host processor, the method comprising:

translating, by the logic die, an address received, as part of a command, through the external interface to produce:
- a first tag value;
- a data address in the memory stack; and
- a tag address in the memory stack;

fetching a second tag value from a location in the memory stack corresponding to the tag address;

comparing the first tag value and the second tag value; and executing the command, based on the comparing of the first tag value and the second tag value.

19. The method of claim 18, further comprising, generating, by the logic die, in response to a read command received through the external interface:
- a first command to fetch the second tag value; and
- a second command to fetch a data word.

20. The method of claim 19, further comprising, generating, by the logic die, a cache hit signal, the cache hit signal having;
- a value of true when the first tag value equals the second tag value; and
- a value of false when the first tag value does not equal the second tag value.

* * * * *